US011423973B2

(12) United States Patent
He

(10) Patent No.: US 11,423,973 B2
(45) Date of Patent: Aug. 23, 2022

(54) CONTEMPORANEOUS SENSE AMPLIFIER TIMINGS FOR OPERATIONS AT INTERNAL AND EDGE MEMORY ARRAY MATS

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/003,823

(22) Filed: Aug. 26, 2020

(65) Prior Publication Data

US 2022/0068354 A1    Mar. 3, 2022

(51) Int. Cl.
*G11C 7/22* (2006.01)
*G11C 11/4091* (2006.01)
*G11C 11/4094* (2006.01)
*G11C 11/4096* (2006.01)
*G11C 11/4076* (2006.01)

(52) U.S. Cl.
CPC ...... *G11C 11/4091* (2013.01); *G11C 11/4076* (2013.01); *G11C 11/4094* (2013.01); *G11C 11/4096* (2013.01)

(58) Field of Classification Search
CPC ............ G11C 11/4091; G11C 11/4096; G11C 11/4076; G11C 11/4094; G11C 11/24; H01L 23/52; H01L 27/10882
See application file for complete search history.

(56) References Cited

U.S. PATENT DOCUMENTS

| 11,024,366 | B1* | 6/2021 | He | G11C 11/4094 |
| 11,087,827 | B1* | 8/2021 | He | H01L 27/10894 |
| 2002/0167852 | A1* | 11/2002 | Cowles | G11C 11/4074 365/201 |
| 2006/0023534 | A1* | 2/2006 | Do | G11C 11/4091 365/205 |
| 2010/0080044 | A1* | 4/2010 | Seo | G11C 8/14 365/149 |
| 2011/0002152 | A1* | 1/2011 | Lane | G11C 29/808 365/207 |
| 2014/0233336 | A1* | 8/2014 | Shin | G11C 7/12 365/205 |
| 2016/0163365 | A1* | 6/2016 | Yang | G11C 7/18 365/51 |
| 2019/0214057 | A1* | 7/2019 | Won | G11C 7/065 |
| 2021/0366534 | A1* | 11/2021 | He | H01L 27/10897 |

* cited by examiner

*Primary Examiner* — Mushfique Siddique
(74) *Attorney, Agent, or Firm* — Dorsey & Whitney LLP

(57) ABSTRACT

A memory hank has banks of sense amplifiers positioned in edge memory array mats that are coupled to digit lines with different lengths than banks of sense amplifiers coupled between inner memory array mats. During a main sense phase of a sense operation, a first sense amplifier bank positioned between an edge memory array mat and an inner memory array mat is activated at a first time prior to activation of a second sense amplifier bank positioned in the edge memory array mat at a second time.

20 Claims, 9 Drawing Sheets

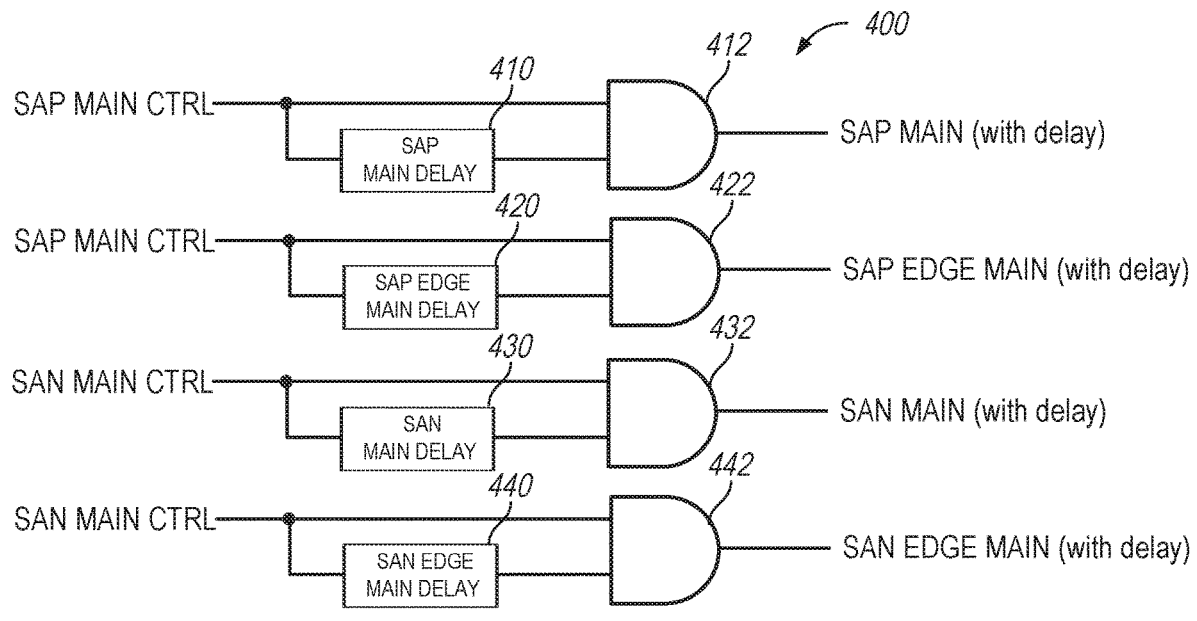
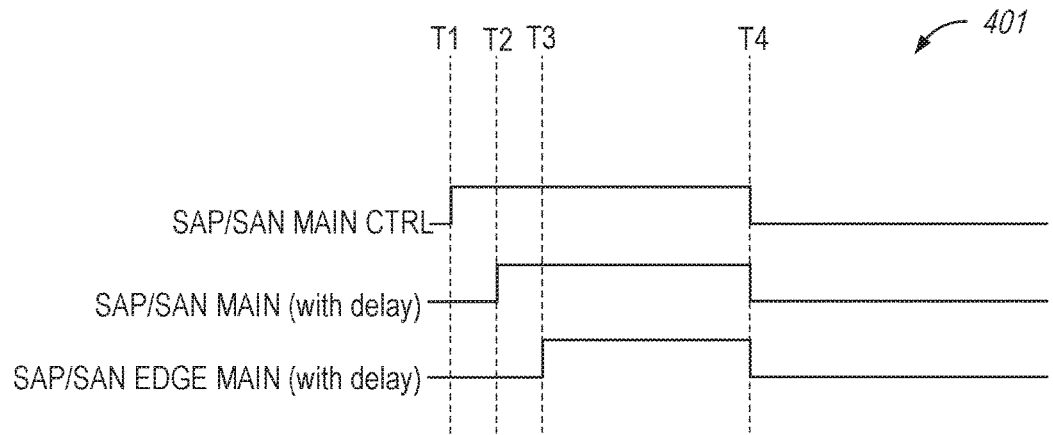
FIG. 4

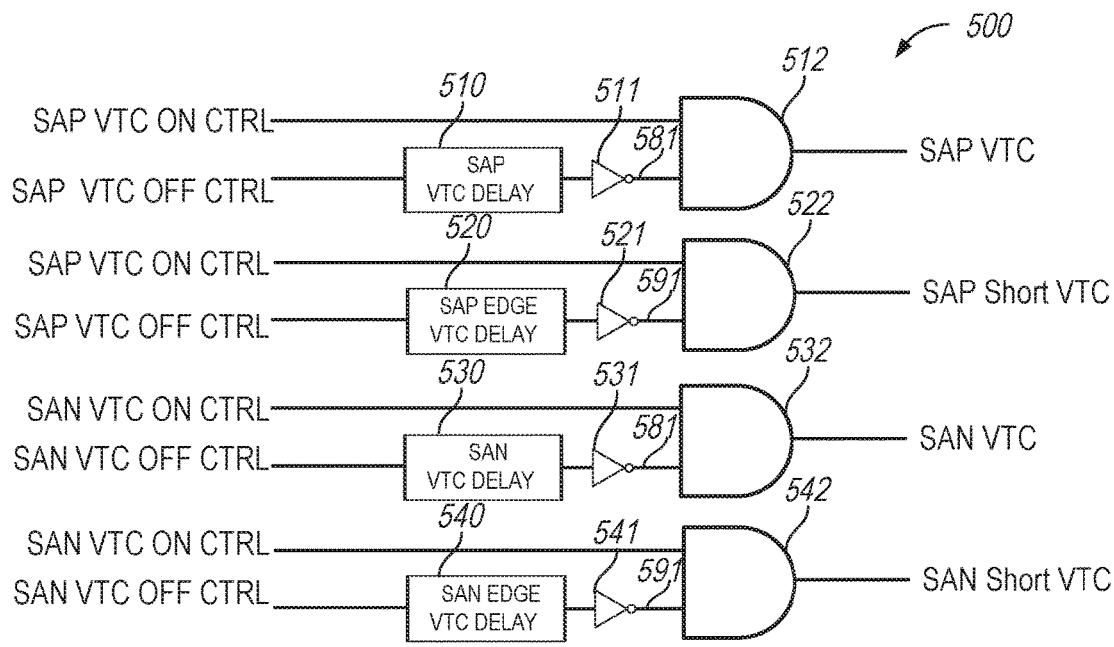
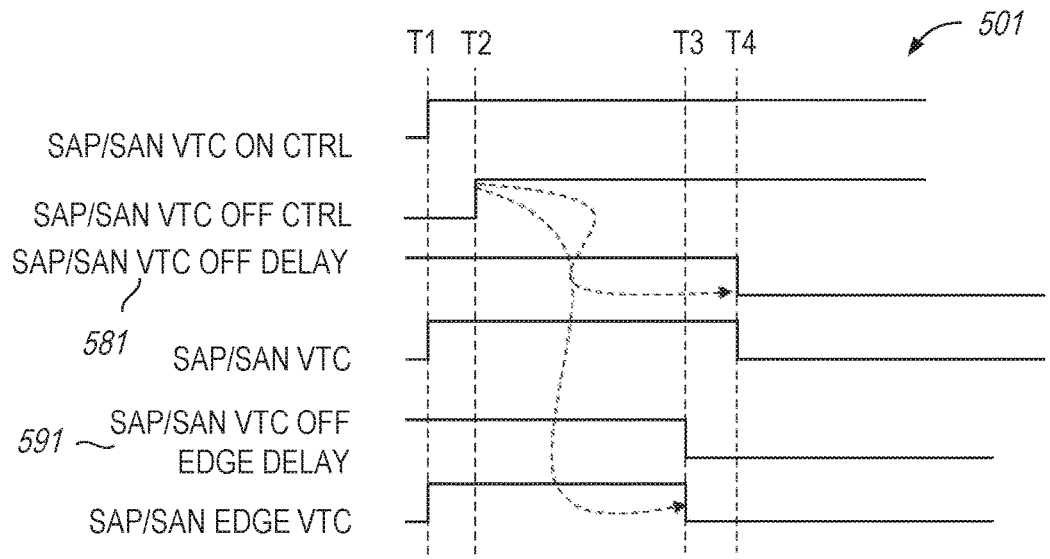
FIG. 5

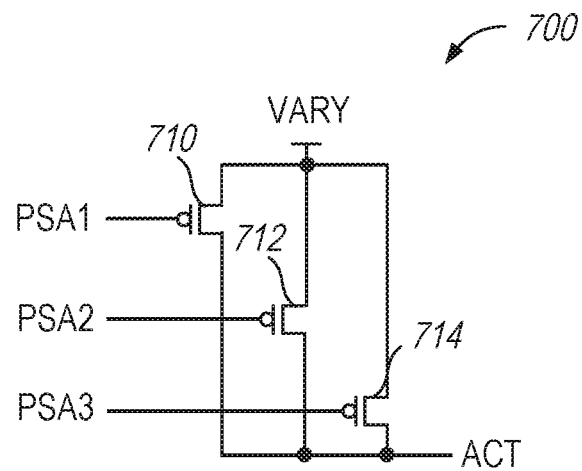
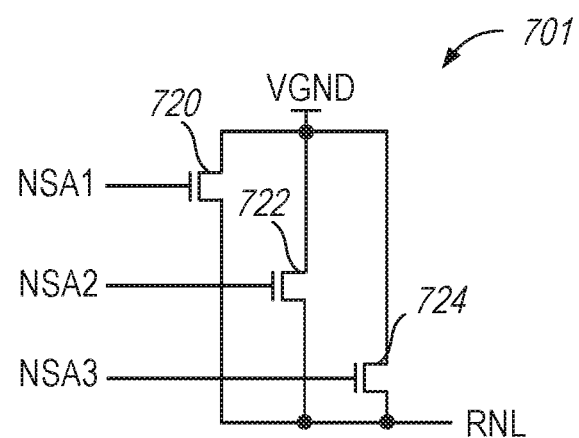
FIG. 7

CONTEMPORANEOUS SENSE AMPLIFIER TIMINGS FOR OPERATIONS AT INTERNAL AND EDGE MEMORY ARRAY MATS

BACKGROUND

Current implementations of dynamic random-access memory (DRAM) device arrays implement row segment sections where even and odd row segments of memory cells are interleaved. Sense amplifiers are connected to sequential row segments, and use one of the two row segments as reference when reading the other row segment. As a result, at the edges of an array, the row segments sections include border row segments. These border segments are interleaved with other row segment sections, but the other row segment sections are not connected to circuitry that allows them to be used for storing data. Therefore, in these border row segment sections, only half of the memory cells in the section are used to store data. Because only half of the memory cells are used, significant areas around the edge of an array are consumed by unused memory cells.

BRIEF DESCRIPTION OF THE DRAWINGS

FIG. 4 illustrates a schematic diagram of a main sense amplifier driver and an exemplary timing diagram for a main sense phase in accordance with an embodiment of the disclosure.

FIG. 5 illustrates a schematic diagram of a VTC driver and an exemplary timing diagram for a main sense phase in accordance with an embodiment of the disclosure.

FIG. 7 depicts a p-side driver circuit and an n-side driver circuit in accordance with embodiments of the disclosure.

DETAILED DESCRIPTION

Figure 1:
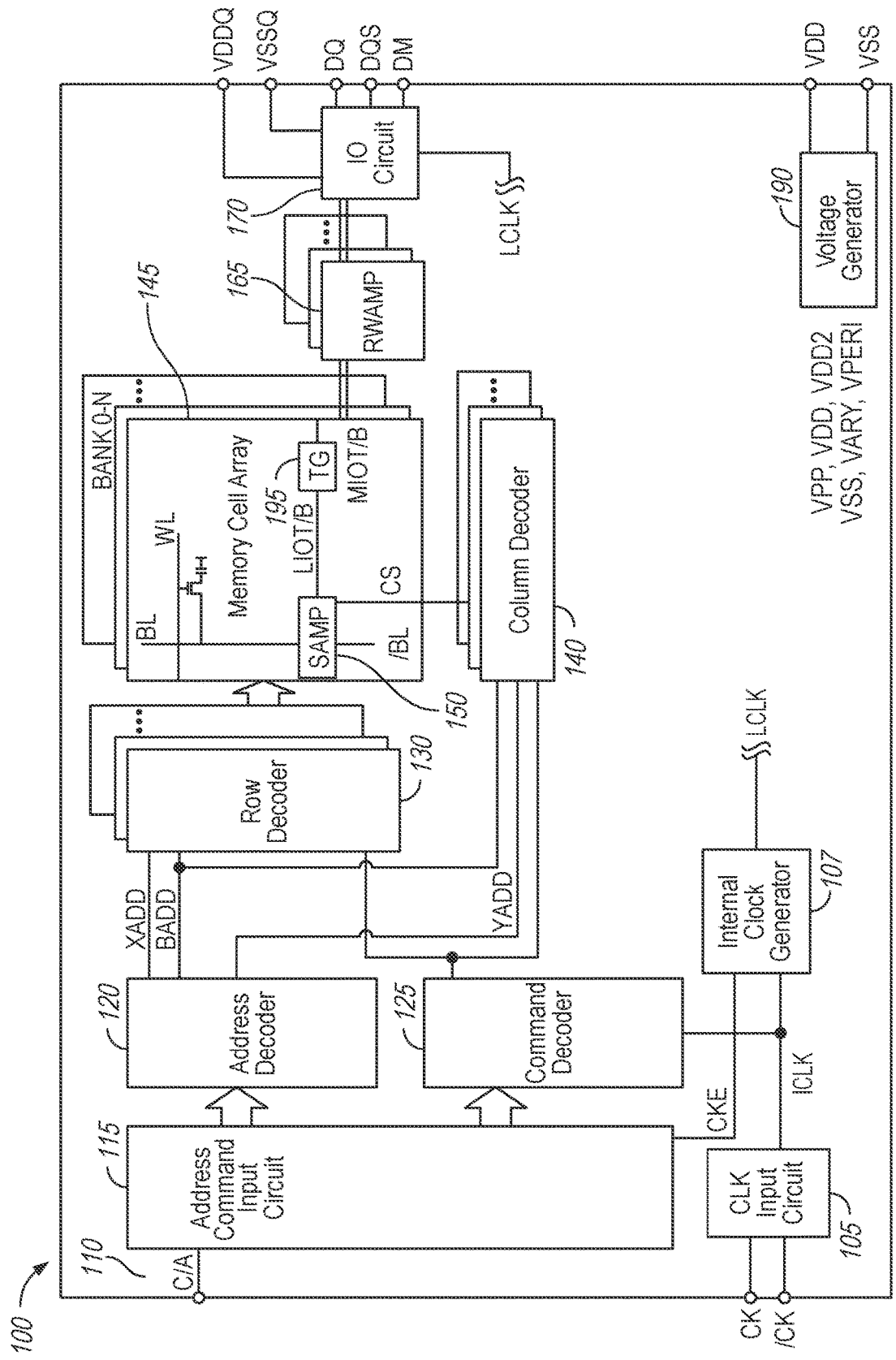
FIG. 1 illustrates a schematic block diagram of a semiconductor device in accordance with an embodiment of the present disclosure.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

This disclosure describes memory array implementations where all memory cells of an edge memory array mat may be configured to be used to store and access data, and sense amplifier operation in the edge memory array mat is optimized to accommodate different digit line length as compared with non-edge memory array mat sense amplifiers. An edge memory array mat may include digit lines (e.g., access lines, bitlines, data input/output (I/O) lines, etc.) that are split in half and a bank of sense amplifiers formed in a region that separates the digit line halves extending perpendicular to the digit lines. The sense amplifiers of the bank of sense amplifiers are coupled to opposing ends of a first subset of the half digit lines pairs (e.g., complementary digit lines formed from individual halves of the first subset of the half digit lines pairs). The edge memory array mat further includes digit line (DL) jumpers or another structure configured to connect a second subset of the half digit line pairs across the region occupied by the bank of sense amplifiers to form combined or extended digit lines that extend to a bank of sense amplifiers coupled between the edge memory array mat and an inner memory array mat (e.g., complementary digit lines formed from the combined or extended digit line and a digit line of the inner memory array mat).

During fabrication, digit lines may be formed in a memory array mat with an interleaved arrangement such that even digit lines are configured to couple to a first bank of sense amplifiers at a first end and odd digit lines are configured to couple to a second bank of sense amplifiers at a second end opposite the first end. To perform a sense operation, sense amplifiers are coupled to two complementary digit lines in such a way that the data state of a memory cell coupled to one of the two complementary digit lines causes the sense amplifier to drive one digit line to a first logical value and the other digit line to a second logical value opposite the first logical value. Thus, the first bank of sense amplifiers may be coupled to a respective second set of digit lines of a first adjacent memory array mat and second bank of sense amplifiers may be coupled to a respective second set of digit lines of a second adjacent memory array mat. For an edge memory array mat that forms an outer edge of a memory array, one set of interleaved digit lines may be coupled to a first bank of sense amplifiers formed near a first (inner) end between the edge memory array mat and an inner memory array mat. However, because a sense amplifier may be coupled between two complementary digit lines or loads to perform a sense operation, the second set of digit lines of the edge memory array mat may be unable to support a sense amplifier coupled to the second (outer) end near an edge of the memory array, as there is no set of complementary digit lines to support operation of the sense amplifier.

Thus, to avoid edge memory array mats having half of the digit lines (and corresponding memory cells) being unused, the digit lines of the edge memory array mat may be split (e.g., or divided) to form a space or region between the digit lines, and a bank of sense amplifiers may be formed in the edge memory array mat in the space or region where the digit lines are split. The sense amplifiers of the bank of amplifiers formed in the space between the digit lines of the edge memory array mat may be coupled to a first subset of the half digit line pairs of the edge array mat. Digit line (DL) jumpers or another structure may be formed to connect a second subset of the half digit line pairs across the region occupied by the bank of sense amplifiers formed in the edge memory array mat. The second subset of the half digit line pairs, when connected via the DL jumper or other structure, form combined or extended digit lines that are configured to couple to a bank of sense amplifiers formed between the edge memory array mat and an inner memory array mat.

However, because the half digit line pairs (e.g., shorter digit lines) connected to the sense amplifiers formed in the edge memory array mat are significantly shorter than the full digit lines (e.g., the longer digit lines, including the extended digit line) connected to the sense amplifiers formed between the edge memory array mat and the inner memory array mat, certain physical characteristics may cause different behavior during a sense operation may between the two different sense amplifiers. For example, during a main sense phase of a sense operation, a time to transition the complementary half digit line pairs to complementary voltage values based on a data state of a target memory cell may be shorter than a time to transition complementary digit line pairs including the extended digit line to complementary voltage values based on a data state of a target memory cell. In addition, during a threshold voltage compensation phase of the sense operation, the shorter digit lines may cause a larger voltage split between the complementary digit lines for a given period of time as compared with the longer digit lines such that the sense amplifiers coupled to the shorter digit lines are biased toward one sense value more so than the sense amplifiers connected to the longer digit lines.

To compensate for the different performance during the main sense phase, the sense amplifiers connected to the longer digit lines may be activated earlier than the sense amplifiers connected to the shorter digit lines. That is, activation of the sense amplifiers (e.g., via sense amplifier P and N (SAP and SAN) drivers configured to provide an activation voltage ACT and a Row Nsense Latch voltage RNL to the sense amplifier) connected to the shorter digit lines may be delayed relative to activation of the sense amplifiers connected to the longer digit lines.

To compensate for the different performance during the threshold voltage compensation phase, a time duration of the threshold voltage compensation phase may be shorter for the sense amplifiers connected to the shorter digit lines than for the sense amplifiers connected to the shorter digit lines. That is, the threshold voltage compensation phase for the sense amplifiers connected to the shorter digit lines may stop before the threshold voltage compensation phase for the sense amplifiers connected to the longer digit lines. In another example, operation of the SAP and SAN drivers may be adjusted for the sense amplifiers connected to the shorter digit lines to mitigate a tendency for a larger voltage split. For example, the SAP and SAN drivers may activated differently (e.g., fewer driver legs or a different SAP to SAN driver ratio) to compensate for the tendency to generate a larger voltage split during the threshold voltage compensation phase.

FIG. 1 illustrates a schematic block diagram of a semiconductor device 100 in accordance with an embodiment of the present disclosure. The semiconductor device 100 includes a memory die. The memory die may include a command/address input circuit 115, an address decoder 120, a command decoder 125, a clock input circuit 105, internal clock generator 107, row decoder 130, column decoder 140, a memory cell array 145, read/write amplifiers 165, an I/O circuit 170, and power circuit 190.

In some embodiments, the semiconductor device 100 may include, without limitation, a dynamic random-access memory (DRAM) device, such as double data rate (DDR) DDR4, DDR5, low power(LP) DDR, integrated into a single semiconductor chip, for example. The die may be mounted on an external substrate, for example, a memory module substrate, a mother board or the like. The semiconductor device 100 may further include a memory cell array 145. The memory cell array 145 includes a plurality of banks, each bank including a plurality of word lines WL, a plurality of bit lines BE (e.g., digit lines, access lines, data I/O lines, etc.), and a plurality of memory cells MC arranged at intersections of the plurality of word lines WL and the plurality of bit lines BL. The selection of the word line WL is performed by a row decoder 130 and the selection of the bit line BL (along with a column select signal CS) is performed by a column decoder 140. Sense amplifiers (SA) 150 are located near their corresponding bit lines BL and connected to at least one respective local I/O line based on the CS signal, which is in turn coupled to a respective one of at least two main I/O line pairs, via transfer gates (TG) 195, which function as switches.

In some embodiments, the memory cell array 145 may include memory array mats having respective digit lines and memory cells. The memory array mats may be separated by areas for control circuitry, including the sense amplifiers 150 connected to a respective subset (e.g., even or odd) bitlines of adjacent memory array mats to perform sense operations on corresponding memory cells. In some examples, a bank of sense amplifiers 150 positioned between two inner memory array mats or positioned between an inner memory array mat and an edge memory array mat (i.e., a memory array mat that includes one edge defining a portion of an outer border of the memory cell array 145) may each be coupled between a respective subset (e.g., even or odd) of complementary bitline pairs, and may be configured to perform a sense operation on a memory cell coupled to one bitline of a corresponding complementary bitline pair of the respective subset of bitline pairs.

In the edge memory array mat, bitline segments may be split (e.g., physically separated or divided), and a bank of sense amplifiers 150 may be formed in a region where the bitline segments are split. The bitline segments may be split in half (e.g., based on a number of rows of connected memory cells) coupled to each half of the bitline segment). Each sense amplifier of the bank of amplifiers 150 may be coupled to a first subset of the half bitline pairs of the edge array mat. Digit line (DL) jumpers or another structure may be formed to connect a second subset of the half bitline pairs across an area occupied by the bank of sense amplifiers 150 formed in the edge memory array mat to provide combined or extended bitlines. The combined or extended bitlines may be connected to the set of sense amplifiers 150 formed between the edge memory array mat and an inner memory array mat. Thus, by being coupled to the first subset of half bitline pairs, the set of sense amplifiers 150 formed in the edge memory array may be connected to a pair of complementary bitlines having a length that is half (e.g., based on a number of rows of connected memory cells) of a length of the combined or extended bitlines coupled to the sense amplifiers 150 positioned between two adjacent memory array mats.

However, because the half digit line pairs (e.g., shorter digit lines) connected to the sense amplifiers 150 formed in the edge memory array mat are significantly shorter than the full digit lines (e.g., the longer digit lines, including the extended digit line) connected to the sense amplifiers 150 formed between the edge memory array mat and the inner memory array mat, certain physical characteristics may cause different behavior during a main sense phase of a sense operation may between the two different sense amplifiers 150. For example, during a main sense phase of the sense operation, a time to transition the complementary half digit line pairs to complementary voltage values based on a data state of a target memory cell may be shorter than a time to transition complementary digit line pairs including the extended digit line to complementary voltage values based on a data state of a target memory cell. In addition, during a threshold voltage compensation phase, the shorter digit lines may cause a larger voltage split between the complementary digit lines for a given period of time as compared with the longer digit lines such that the sense amplifiers coupled to the shorter digit lines are biased toward one sense value more so than the sense amplifiers connected to the longer digit lines.

To compensate for the different performance during the main sense phase, the sense amplifiers 150 connected to the longer digit lines may be activated earlier than the sense amplifiers 150 connected to the shorter digit lines. That is, activation of the sense amplifiers 150 (e.g., via sense amplifier P and N (SAP and SAN) drivers configured to provide an activation voltage ACT and a Row Nsense Latch voltage RNL to the sense amplifier 150) connected to the shorter digit lines may be delayed relative to activation of the sense amplifiers 150 connected to the longer digit lines.

To compensate for the different performance during the threshold voltage compensation phase, a time duration of the threshold voltage compensation phase may be shorter for the sense amplifiers 150 connected to the shorter digit lines than for the sense amplifiers 150 connected to the longer digit lines. That is, the threshold voltage compensation phase for the sense amplifiers 150 connected to the shorter digit lines may stop before the threshold voltage compensation phase for the sense amplifiers 150 connected to the longer digit lines. In another example, operation of the SAP and SAN drivers may be adjusted for the sense amplifiers 150 connected to the shorter digit lines to mitigate a tendency for a larger voltage split. For example, the SAP and SAN drivers may activated differently (e.g., fewer driver legs or a different SAP to SAN driver ratio) to compensate for the tendency to generate a larger voltage split during the threshold voltage compensation phase.

The semiconductor device 100 may employ a plurality of external terminals that include address and command terminals coupled to command/address bus (C/A), clock terminals CK and /CK, data terminals DQ, DQS, and DM, power supply terminals VDD, VSS, VDDQ, and VSSQ, and the ZQ calibration terminal (ZQ).

The command/address terminals may be supplied with an address signal and a bank address signal from outside via command/address bus 110. The address signal and the bank address signal supplied to the address terminals are transferred, via the command/address input circuit 115, to an address decoder 120. The address decoder 120 receives the address signal and decodes the address signal to provide decoded address signal ADD. The ADD signal includes a decoded row address signal and a decoded column address signal. The decoded row address signal is provided to the row decoder 130, and a decoded column address signal is provided to the column decoder 140. The address decoder 120 also receives the bank address signal and supplies the bank address signal to the row decoder 130, the column decoder 140.

The command/address terminals may further be supplied with a command signal from outside, such as, for example, a memory controller. The command signal may be provided, via the C/A bus, to the command decoder 125 via the command/address input circuit 115. The command decoder 125 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory cell array 145 designated by these row address and column address. The read data DQ is output to outside from the data terminals DQ (data), DQS (data strobe), and DM (data mask) via read/write amplifiers 165 and an input/output circuit 170. Similarly, when the write command is issued and a row address and a column address are timely supplied with this command, and then write data is supplied to the data terminals DQ, DQS, DM, the write data is received by data receivers in the input/output circuit 170, and supplied via the input/output circuit 170 and the read/write amplifiers 165 to the memory cell array 145 and written in the memory cell designated by the row address and the column address.

Turning to the explanation of the external terminals included in the semiconductor device 100, the clock terminals CK and /CK are supplied with an external clock signal and a complementary external clock signal, respectively. The external clock signals (including complementary external clock signal) may be supplied to a dock input circuit 105. The clock input circuit 105 may receive the external clock signals to generate an internal clock signal ICLK. The internal clock signal ICLK is supplied to an internal clock generator 107 and thus a phase controlled internal clock signal LCLK is generated based on the received internal clock signal ICLK. Although not limited thereto, a delay-locked loop (DLL) circuit, a duty cycle correction (DCC) circuit, or a combination thereof may be used as the internal clock generator 107. The phase controlled internal clock signal LCLK may be used as a timing signal for determining an output timing of read data.

The power supply terminals are supplied with power supply potentials VDD and VSS. These power supply potentials VDD2 and VSS are supplied to the power circuit 190. The power circuit 190 generates various internal potentials VKK, VARY, VPERI, and the like based on the power supply potentials VDD2 and VSS. The internal potential VKK is mainly used in the row decoder 130, the internal potential VARY are mainly used in the sense amplifiers included in the memory cell array 145, and the internal potential VPERI is used in many other circuit blocks.

The power supply terminals are also supplied with power supply potentials VDDQ and VSSQ. These power supply potentials VDDQ and VSSQ are supplied to the input/output circuit 170. The power supply potentials VDDQ and VSSQ are typically the same potentials as the power supply potentials VDD2 and VSS, respectively. However, the dedicated power supply potentials VDDQ and VSSQ are used for the input/output circuit 170 so that power supply noise generated by the input/output circuit 170 does not propagate to the other circuit blocks.

Figure 2:
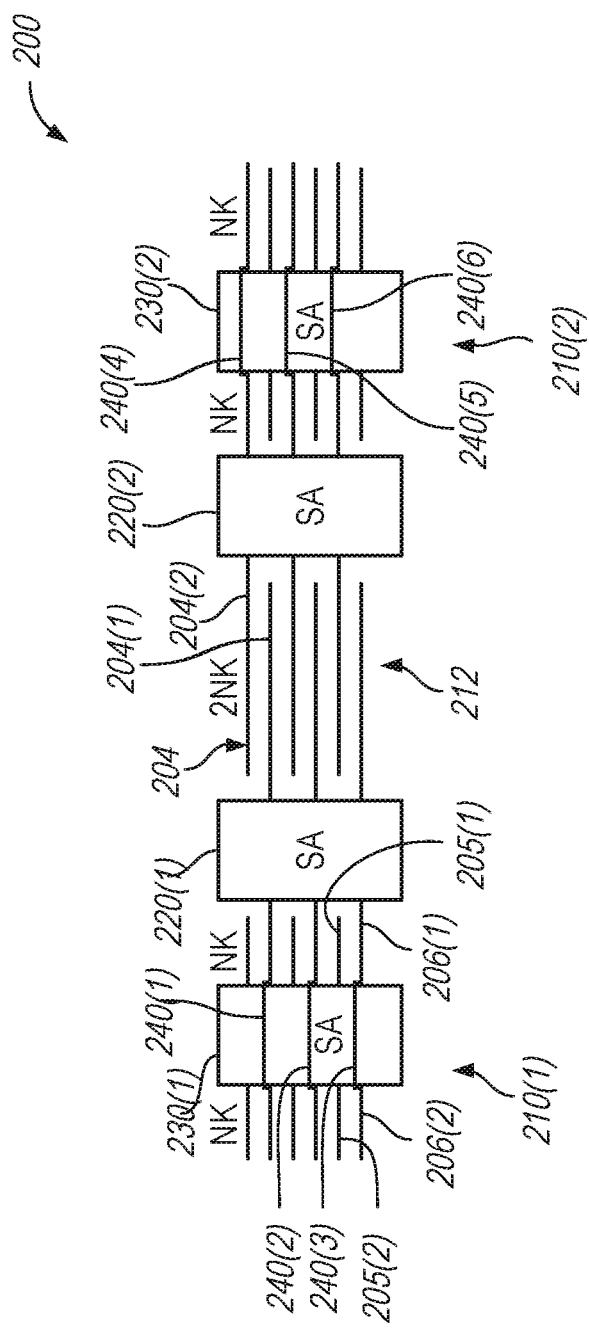
FIG. 2 illustrates a schematic block diagram of a portion of a memory array in accordance with an embodiment of the disclosure.

FIG. 2 illustrates a schematic block diagram of a portion of a memory array 200 in accordance with an embodiment of the disclosure. The memory array 200 includes a pair edge memory array mats 210(1)-(2) positioned on opposite sides of an inner memory array mat 212, sense amplifier bank 220(1) and sense amplifier bank 220(2) positioned between the inner memory array mat 212 and a respective one of the pair edge memory array mats 210(1)-(2), sense amplifier bank 230(1) positioned in the edge memory array mat 210(1) and sense amplifier bank 230(2) positioned in the edge memory array mat 210(2). The memory cell array 145 of FIG. 1 may implement the memory array 200 of FIG. 2.

The inner memory array mat 212 may include individual digit line (e.g., bitline, access line, or data I/O line) segments digit line segments 204, with a first set of the digit line segments 204 coupled to the sense amplifier bank 220(1) and a second set of the digit line segments 204 interleaved with the first set coupled to the sense amplifier bank 220(2).

The pair edge memory array mats 210(1)-(2) may each include pairs of digit line segments 205(1)-(2) arranged on either side of and coupled to the sense amplifier bank 230(1) or the sense amplifier bank 230(2), respectively. The pair edge memory array mats 210(1)-(2) may each further include pairs of digit line segments 206(1)-(2) arranged on either side of and coupled together via a respective one of the DL jumpers 240(1)-(6) to form combined or extended digit line segments. The pairs of digit line segments 205(1)-(2) may be interleaved with the pairs of digit line segments 206(1)-(2). Within the memory array mat 210(1), each pair of the pairs of digit line segments 205(1)-(2) may be coupled to a respective sense amplifier of the sense amplifier bank 230(1) and each of the extended or combined digit line segments (e.g., pair of the pairs of digit line segments 206(1)-(2) coupled together via respective ones of the DL jumpers 240(1)-(3)) may be coupled to a respective sense amplifier of the sense amplifier bank 220(1). Within the memory array mat 210(2), each pair of the pairs of digit line segments 205(1)-(2) may be coupled to a respective sense amplifier of the sense amplifier bank 230(2) and each of the extended or combined digit line segments (e.g., a pair of the pairs of digit line segments 206(1)-(2) (coupled together via respective ones of the DL jumpers 240(4)-(6)) may be coupled to a respective sense amplifier of the sense amplifier bank 220(1).

The DL jumpers 240(1)-(6) may be formed to cross an area or region occupied by the sense amplifier bank 230(1) or the sense amplifier bank 230(2) to connect one digit line segment 206(1) to a corresponding digit line segment 206(2). The DL jumpers 240(1)-(6) may be structurally formed using a different layer than the pairs of digit line segments 205(1)-(2), the pairs of digit line segments 206(1)-(2), and the sense amplifier bank 230(1) or sense amplifier bank 230(2). Each of the DL jumpers 240(1)-(6) may be constructed from a conductive material. For example, the digit line segment 205(1), the digit line segment 205(2), the digit line segment 206(1), the digit line segment 206(2), the sense amplifier bank 230(1), and sense amplifier bank 230(2) may be formed, at least in part, using a first metal layer, and the DL jumpers 240(1)-(6) may include a second metal layer portion that extends across an area that includes the respective sense amplifier bank 230(1) or the sense amplifier bank 230(2). The second metal layer may be above or below the first metal layer, in some examples.

Each individual digit line segment of the pairs of digit line segments 205(1)-(2) and the pairs of digit line segments 206(1)-(2) may have a length (e.g., based on a number of coupled rows of memory cells (not shown)) that is half of a length of the digit line segments 204 of the inner memory array mat 212. For example, each of the digit line segment 205(1), the digit line segment 205(2), the digit line segment 206(1), and the digit line segment 206(2) may have a length of N thousand (NK) rows, and each of the digit line segments 204 may have a length of 2NK rows. In some examples, N may be equal to any integer, such as 1, 2, 4, 8, etc.

A NK plus NK or 2NK length of the combined or extended digit line segments (e.g., the pairs of digit line segments 206(1)-(2) connected together by one of the DL jumpers 240(1)-(6)) may match the 2NK length of each of the digit line segments 204. For example, the combined or extended digit line segment that includes the DL jumper 240(1) and the digit line 204(1) may form complementary 2NK length digit lines that are coupled to a particular sense amplifier of the sense amplifier bank 220(1). Similarly, the combined or extended digit line segment that includes the DL jumper 240(4) and the digit line 204(2) may form complementary 2NK length digit lines that are coupled to a particular sense amplifier of the sense amplifier bank 220(2). Differences in relative lengths of a pair of digit line coupled to any sense amplifier of any of the sense amplifier bank 220(1), sense amplifier bank 220(2), sense amplifier bank 230(1), or sense amplifier bank 230(2) may negatively affect operation of the sense amplifier due to capacitive and impedance differences. Thus, because the digit line segment 205(1) and the digit line segment 205(2) have a common NK length, the sense amplifiers of the sense amplifier hank 230(1) and the sense amplifier bank 230(2) being coupled to individual pairs of the pairs of digit line segments 205(1)-(2) may experience similar capacitive and impedance loads on coupled digit line segments 205(1) and 205(2). Similarly, because each of the digit line segments 204 and the combined or extended digit line segments (e.g., a pair of the digit line segments 206(1)-(2) coupled together via the DL jumpers 240(1)-(6)) have a common 2NK length, the sense amplifiers of the sense amplifier bank 220(1) and the sense amplifier bank 220(2) may experience similar capacitive and impedance loads.

In some examples, sense amplifier of the sense amplifier bank 230(1) and the sense amplifier bank 230(2) may be schematically similar to sense amplifiers of the sense amplifier bank 220(1) and the sense amplifier bank 220(2). In some examples, components of the sense amplifiers of the sense amplifier bank 230(1) and the sense amplifier bank 230(2) may have a different (e.g., smaller) size than schematically common components of the sense amplifier bank 230(1) and the sense amplifier bank 230(2) to accommodate the differences in digit line segment lengths (e.g., NK vs. 2NK). The sense amplifiers of the sense amplifier bank 230(1) and the sense amplifier bank 230(2) having smaller components than the sense amplifiers of the sense amplifier bank 220(1) and the sense amplifier bank 220(2) may result in a smaller layout area for the sense amplifiers of the sense amplifier bank 230(1) and the sense amplifier bank 230(2) as compared with the sense amplifiers of the sense amplifier bank 220(1) and the sense amplifier bank 220(2). In other examples, the sense amplifier bank 230(1) and the sense amplifier bank 230(2) may be schematically different than the sense amplifier bank 220(1) and the sense amplifier bank 220(2). For example, the sense amplifier bank 230(1) and the sense amplifier bank 230(2) may include basic sense amplifier circuitry and the sense amplifier bank 220(1) and the sense amplifier bank 220(2) may include threshold voltage compensation circuitry in addition to the basic sense amplifier circuitry to accommodate sensing data on longer digit line segments digit line segments 204 and the respective combinations of the digit line segment 206(1), one of the DL jumpers 240(1)-(6), and the digit line segment 206(2).

While FIG. 2 depicts the inner memory array mat 212 with 6 of the digit line segments digit line segments 204 and depicts each of the pair edge memory array mats 210(1)-(2) with 6 pairs of digit line segments (e.g., 3 of the pairs of digit line segments 205(1)-(2) and 3 of the pairs of digit line segments 206(1)-(2)), it is appreciated that the inner memory array mat 212 and each of the pair edge memory array mats 210(1)-(2) may include more than 6 digit line segments.

Figure 3:
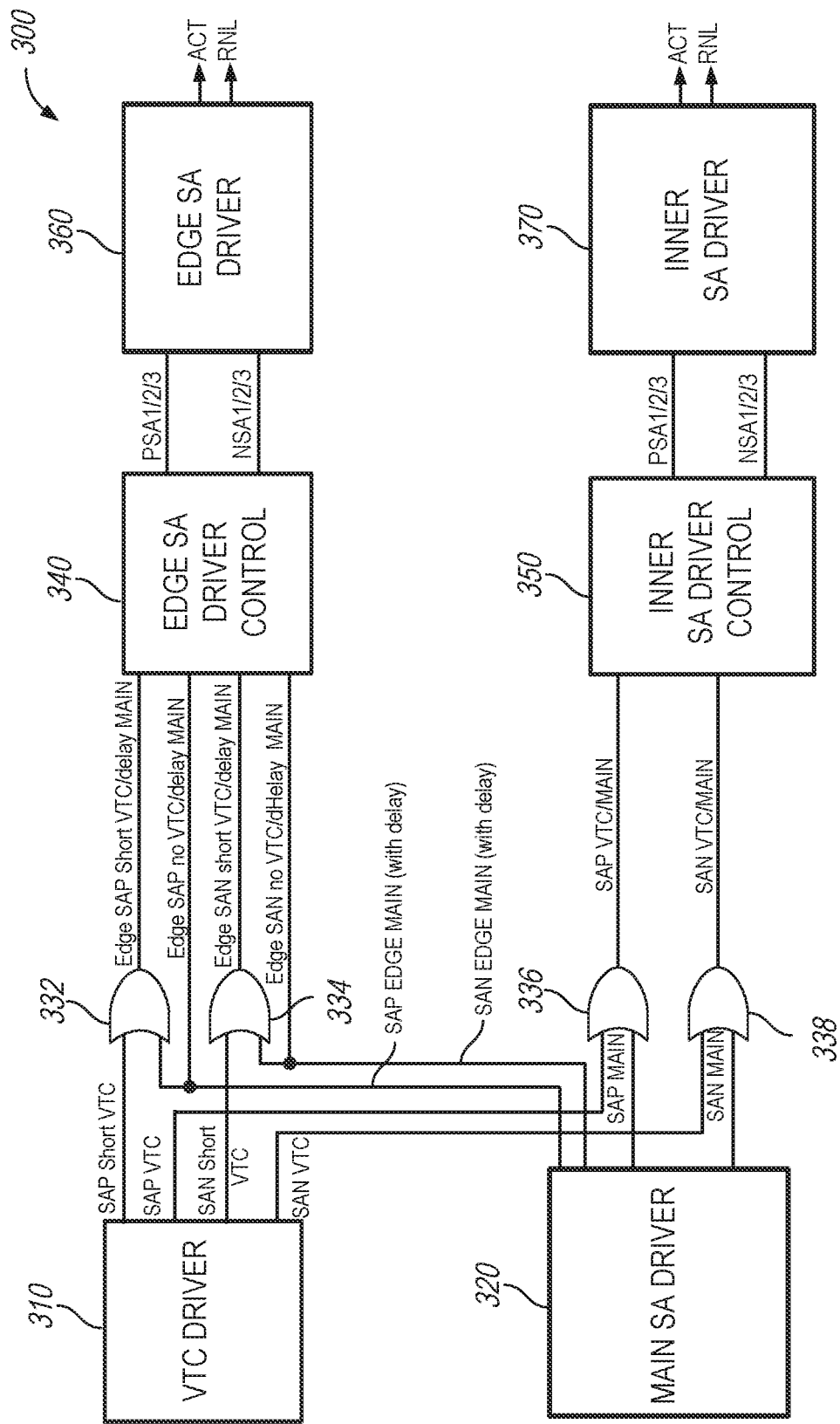
FIG. 3 illustrates a block diagram of circuitry of a semiconductor device for performing sense operations in accordance with an embodiment of the disclosure.

FIG. 3 illustrates a block diagram of circuitry of a semiconductor device 300 for performing sense operations in accordance with an embodiment of the disclosure. The semiconductor device 100 of FIG. 1 may implement the circuitry of the semiconductor device 300, in some examples. The semiconductor device 200 may include a VTC driver 310 and a main sense amplifier driver 320 each coupled to an edge sense amplifier driver control circuit 340 and a sense amplifier driver control circuit 350 via OR gates 332, 334, 336, and 338. The edge sense amplifier driver control circuit 340 may be coupled to an edge sense amplifier driver 360 and the sense amplifier driver control circuit 350 may be coupled to a sense amplifier driver 370. The edge sense amplifier driver 360 may be configured to provide respective activation signals ACT and RNL to sense amplifiers connected to shorter digit lines and the sense amplifier driver 370 may be configured to provide respective activation signals ACT and RNL to sense amplifiers connected to longer digit lines. In some examples, the shorter digit lines may be half as long as the longer digit lines.

The VTC driver 310 may be configured to control the threshold voltage compensation (VTC) operation by providing VTC control signals (e.g., SAP VTC, SAP Short VTC, SAN VTC, and SAN Short VTC signals). The SAP/SAN VTC control signals may have different timing characteristics than the SAP/SAN Short VTC control signals, in some examples. For example, during a VTC operation, the SAP/SAN VTC control signals may have a longer pulse width than the SAP/SAN Short VTC control signals.

The main sense amplifier driver 320 may be configured to control the main sense operation by providing main sense operation control signals (e.g., SAP MAIN, SAP EDGE MAIN (with delay), SAN MAIN, and SAN EDGE MAIN (with delay) signals). The SAP/SAN MAIN control signals may have different timing characteristics than the SAP/SAN EDGE MAIN (with delay) control signals, in some examples. For example, the SAP/SAN MAIN control signals may cause the main sense operation to be initiated before the main sense operation initiated by the SAP; SAN EDGE MAIN (with delay) control signals.

The OR gate 332 may be configured to perform an OR operation between the SAP Short VTC control signal and the SAP EDGE MAIN (with delay) control signal to provide the EDGE SAP short VTC/delay Main control signal. The OR gate 334 may be configured to perform an OR operation between the SAN Short VTC control signal and the SAN EDGE MAIN (with delay) control signal to provide the EDGE SAN short VTC/delay Main control signal. The OR gate 336 may be configured to perform an OR operation between the SAP VTC control signal and the SAP MAIN control signal to provide the SAP VTC/MAIN control signal. The OR gate 338 may be configured to perform an OR operation between the SAN VTC control signal and the SAN MAIN control signal to provide the SAN VTC/MAIN control signal.

The main sense amplifier driver 320 may provide the SAP EDGE MAIN (with delay) and the SAN EDGE MAIN (with delay) control signals directly to the edge sense amplifier driver control circuit 340 as the EDGE SAP no VTC/delay Main and EDGE SAN no VTC/delay Main control signals, respectively (e.g., the EDGE SAP no VTC/delay Main and the EDGE SAN no VTC/delay Main are inactive during the VTC operation, but may be active during the main sense operation).

The edge sense amplifier driver control circuit 340 may be configured to provide the p-side sense amplifier control signals PSA1/2/3 based on the EDGE SAP short VTC/delay Main and EDGE SAP no VTC/delay Main control signals and to provide the n-side sense amplifier control signals NSA1/2/3 based on the EDGE SAN short VTC/delay Main and EDGE SAN no VTC/delay Main control signals. In response to the PSA1/2/3 and the NSA1/2/3 control signals, the edge sense amplifier driver 360 may provide the respective ACT and RNL signals during VTC and main sense operations.

The sense amplifier driver control circuit 350 may be configured to provide the p-side sense amplifier control signals PSA1/2/3 based on the SAP VTC/MAIN control signal and to provide the n-side sense amplifier control signals NSA1/2/3 based on the SAN VTC/MAIN control signal. In response to the PSA1/2/3 and the NSA1/2/3 control signals, the sense amplifier driver 370 may provide the respective ACT and RNL signals during VTC and main sense operations.

In operation, to perform a sense operation, sense amplifiers are coupled to two complementary digit lines in such a way that the data state of a memory cell coupled to one of the two complementary digit lines causes the sense amplifier to drive one digit line to a first logical value and the other digit line to a second logical value opposite the first logical value. A sense operation may typically include a main sense phase where the data state of the memory cell is reflected in complementary voltages driven on a pair of connected digit lines. In some examples, a sense amplifier may have circuitry to perform a VTC compensation phase to compensate for threshold voltage differences between the transistors of the sense amplifier.

Because a sense operation involves charging and discharging of digit lines, a length of a digit line may affect charging and discharging performance. To compensate for the different performance during the main sense phase of the sense operation, the sense amplifiers connected to the longer digit lines may be activated earlier than the sense amplifiers connected to the shorter digit lines. That is, activation of the sense amplifiers (e.g., via the edge sense amplifier driver 360 (e.g., via provision of the ACT and the RNL voltages) connected to the shorter digit lines may be delayed relative to activation of the sense amplifiers connected to the longer digit lines via the sense amplifier driver 370. Thus, the main sense amplifier driver 320 may activate the SAP/SAN MAIN signals before activation of the SAP/SAN EDGE MAIN (with delay) signals. A delay between activation of the SAP/SAN MAIN signals and the SAP/SAN EDGE MAIN (with delay) signals may be based on the operational differences between the digit lines connected to the respective sense amplifiers. In some examples, the delay is less than 5 ns, such as 1 to 2 ns.

To compensate for the different performance during the VTC phase, a time duration of the VTC phase may be shorter for the sense amplifiers connected to the shorter digit lines than for the sense amplifiers connected to the longer digit lines. That is, the VTC phase for the sense amplifiers connected to the shorter digit lines may stop before the VTC phase for the sense amplifiers connected to the longer digit lines. During the VTC driver 310 may activate the SAP/SAN VTC and SAP/SAN Short VTC controls signals at the same time, but may set the SAP/SAN Short VTC controls signals inactive before setting the SAP/SAN Short VTC controls signals inactive.

In another embodiment, additionally or alternatively to adjusting the VTC phase duration, the edge sense amplifier driver control circuit 340 and the sense amplifier driver control circuit 350 may be configured to selectively activate a subset of the respective PSA1/2/3 and NSA1/2/3 control signals to control a drive strength (e.g., width) and/or SAN:SAP ratio of the edge sense amplifier driver 360 and the sense amplifier driver 370, respectively. For example, the sense amplifier driver control circuit 350 may set a different combination of the respective PSA1/2/3 and NSA1/2/3 control signals than the edge sense amplifier driver control circuit 340 such that more legs of the sense amplifier driver 370 are activated as compared with the edge sense amplifier driver 360. Additionally or alternatively, of a connected sense amplifier has a tendency to pull too high or too low, the edge sense amplifier driver control circuit 340 and/or the sense amplifier driver control circuit 350 may set a combination of the respective PSA1/2/3 and NSA1/2/3 control signals to something other than a SAN:SAP ratio of 1:1 to mitigate the effects of the tendency to pull too high or too low.

FIG. 4 illustrates a schematic diagram of a main sense amplifier driver 400 and an exemplary timing diagram 401 for a main sense phase in accordance with an embodiment of the disclosure. The semiconductor device 100 of FIG. 1 and/or the main sense amplifier driver 320 of FIG. 3 may implement the main sense amplifier driver 400. The main sense amplifier driver 400 may be configured to provide SAP MAIN, SAP EDGE MAIN (with delay), SAN MAIN, and SAN EDGE MAIN (with delay) signals responsive to the SAP/SAN MAIN CTRL signals.

The main sense amplifier driver 400 may be configured to provide the SAP MAIN (with delay) signal via a SAP main delay 410 and a AND gate 412. The AND gate 412 may be configured to apply AND logic to the SAP MAIN CTRL signal and a delayed SAP MAIN CTRL signal via the SAP main delay 410 to provide the SAP MAIN (with delay) signal.

The main sense amplifier driver 400 may be configured to provide the SAP EDGE MAIN (with delay) signal via a SAP edge main delay 420 and a AND gate 422. The AND gate 422 may be configured to apply AND logic to the SAP MAIN CTRL signal and a delayed SAP MAIN CTRL signal via the SAP edge main delay 420 to provide the SAP EDGE MAIN (with delay) signal.

The main sense amplifier driver 400 may be configured to provide the SAN MAIN (with delay) signal via a SAN main delay 430 and a AND gate 432. The AND gate 432 may be configured to apply AND logic to the SAN MAIN CTRL signal and a delayed SAN MAIN CTRL signal via the SAN main delay 430 to provide the SAN MAIN (with delay) signal.

The main sense amplifier driver 400 may be configured to provide the SAN EDGE MAIN (with delay) signal via a SAN edge main delay 440 and a AND gate 442. The AND gate 442 may be configured to apply AND logic to the SAN MAIN CTRL signal and a delayed SAN MAIN CTRL signal via the SAN edge main delay 440 to provide the SAN EDGE MAIN (with delay) signal.

In some examples, the SAP main delay 410 and the SAN main delay 430 may be a first delay and the SAP edge main delay 420 and the SAN edge main delay 440 may be a second delay. In some examples, the first delay may be shorter than the second delay. As shown in the timing diagram 401, the SAP/SAN MAIN CTRL signals transition to active at time T1. After the first delay (e.g., via the delays SAP main delay 410 and SAN main delay 430), the SAP/SAN MAIN signals transition to active at time T2. After the second delay (e.g., via the delays SAP edge main delay 420 and SAN edge main delay 440), the SAP/SAN EDGE MAIN (with delay) signals transition to active at time T3. At time T4, the SAP/SAN MAIN CTRL signals transition to inactive, and in response, each of the SAP/SAN EDGE MAIN (with delay) signals and each of the SAP/SAN MAIN (with delay) signals transition to inactive.

It is appreciated that the SAP main delay 410 and the SAN main delay 430 may have different delays and the SAP edge main delay 420 and the SAN edge main delay 440 may have different delays. In some examples, the SAP main delay 410, the SAP edge main delay 420, the SAN main delay 430, and the SAN edge main delay 440 may be dynamically changed or may be programmed (e.g., via a fuse or an antifuse). It is also appreciated that the timing diagram 401 is exemplary, and relative timing characteristics between the signals may differ from the depiction in the timing diagram 401 without departing from the scope of the disclosure.

FIG. 5 illustrates a schematic diagram of a VTC driver 500 and an exemplary timing diagram 501 for a main sense phase in accordance with an embodiment of the disclosure. The semiconductor device 100 of FIG. 1 and/or the VTC driver 310 of FIG. 3 may implement the VTC driver 500. The main sense amplifier driver 400 may be configured to provide SAP VTC, SAP Short VTC, SAN VTC, and SAN Short VTC signals responsive to the SAP/SAN MAIN CTRL signals.

The VTC driver 500 may be configured to provide the SAP VTC signal via a SAP VTC delay 510, an inverter 511, and an AND gate 512. The AND gate 512 may be configured to apply AND logic to the SAP VTC ON CTRL signal and a delayed SAP VTC OFF CTRL signal via the SAP VTC delay 510 and the inverter 511 to provide the SAP VTC signal.

The VTC driver 500 may be configured to provide the SAP Short VTC signal via a SAP edge VTC delay 520, an inverter 521, and a AND gate 522. The AND gate 522 may be configured to apply AND logic to the SAP VTC ON CTRL signal and a delayed SAP VTC OFF CTRL signal via the SAP edge VTC delay 520 and the inverter 521 to provide the SAP Short VTC signal.

The VTC driver 500 may be configured to provide the SAN VTC signal via a SAN VTC delay 530, a inverter 531, and a AND gate 532. The AND gate 532 may be configured to apply AND logic to the SAN VTC ON CTRL signal and a delayed SAN VTC OFF CTRL signal via the SAN VTC delay 530 and the inverter 531 to provide the SAN VTC signal.

The VTC driver 500 may be configured to provide the SAN Short VTC signal via a SAN edge VTC delay 540, a inverter 541, and a AND gate 542. The AND gate 542 may be configured to apply AND logic to the SAN VTC ON CTRL signal and a delayed SAN VTC OFF CTRL signal via the SAN edge VTC delay 540 and the inverter 541 to provide the SAN EDGE MAIN (with delay) signal.

In some examples, the SAP VTC delay 510 and the SAN VTC delay 530 may be a first delay and the SAP edge VTC delay 520 and the SAN edge VTC delay 540 may be a second delay. In some examples, the first delay may be longer than the second delay. As shown in the timing diagram 501, the SAP/SAN VTC ON CTRL signals transition to active at time T1 and the SAP/SAN VTC OFF CTRL signals transition to active at time T2. In response to the transition of the SAP/SAN VTC ON CTRL signals, both the SAP/SAN VTC and the SAP/SAN Short VTC signals contemporaneously transition to active (e.g., the output of the inverter 511, the inverter 521, the inverter 531, and the inverter 541 are all set active in response to the SAP/SAN VTC OFF CTRL signals starting inactive). After the second delay (e.g., via the delays SAP edge VTC delay 520 and SAN edge VTC delay 540), the SAP/SAN Short VTC signals transition to active at time T3 in response to the transition of the SAP/SAN VTC OFF CTRL signals (at nodes 591). After the first delay (e.g., via the delays SAP VTC delay 510 and SAN VTC delay 530), the SAP/SAN VTC signals transition to active at time T4 in response to the transition of the SAP/SAN VTC OFF CTRL signals (at nodes 581).

It is appreciated that the SAP VTC delay 510 and the SAN VTC delay 530 may have different delays and the SAP edge VTC delay 520 and the SAN edge VTC delay 540 may have different delays. In some examples, the SAP VTC delay 510, the SAP edge VTC delay 520, the SAN VTC delay 530, and the SAN edge VTC delay 540 may be dynamically changed or may be programmed (e.g., via a fuse or an antifuse). It is appreciated that the SAP main delay 510 and the SAN main delay 530 may have different delays and the SAP edge main delay 520 and the SAN edge main delay 540 may have different delays. In some examples, the SAP main delay 510, the SAP edge main delay 520, the SAN main delay 530, and the SAN edge main delay 540 may be dynamically changed or may be programmed (e.g., via a fuse or an antifuse). It is also appreciated that the timing diagram 501 is exemplary, and relative timing characteristics between the signals may differ from the depiction in the timing diagram 501 without departing from the scope of the disclosure.

Figure 6:
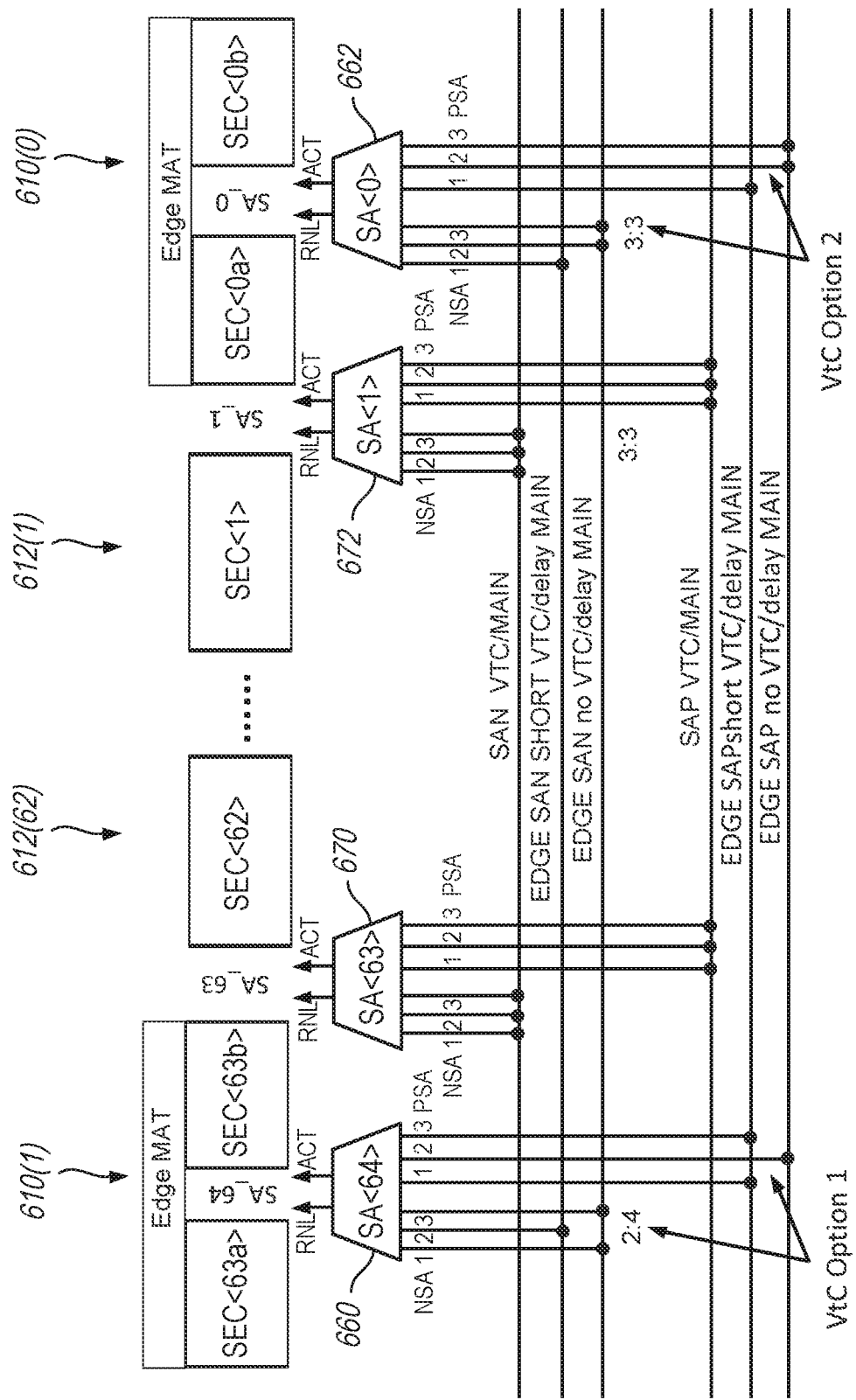
FIG. 6 illustrates a block diagram of a memory bank in accordance with an embodiment of the disclosure.

FIG. 6 illustrates a block diagram of a memory bank 600 in accordance with an embodiment of the disclosure. The memory bank includes a pair edge memory array mats 610(0)-(1) positioned on opposite sides of inner memory array mats 612(1)-(62), sense amplifier bank SA_1 positioned between the inner memory array mat 612(1) and the edge memory array mat 610(0), sense amplifier bank SA_63 positioned between the inner memory array mat 612(62) and the edge memory array mat 610(1), sense amplifier bank SA_0 positioned in the edge memory array mat 610(0) and sense amplifier bank SA_64 positioned in the edge memory array mat 610(1). The memory cell array 145 of FIG. 1 may implement the memory bank 600.

The inner memory array mats 612(1)-(62) (e.g., sections SEC<1:62>) may each include individual digit line (e.g., bitline, access line, or data I/O line) segments.

The pair edge memory array mats 610(0)-(1) (e.g., sections SEC<0a:0b> and SEC<63a:63b>) may each include digit line segments arranged on either side of and coupled to the sense amplifier banks SA_0 or SA_64, respectively. Half of the digit line segments arranged on either side the SA_0 and SA_64 may be coupled together via a respective DL jumper (not shown, e.g., DL jumpers 240(1)-(6) of FIG. 2) to form combined or extended digit line segments. Within the edge memory array mat 610(0), half of the digit line segments from each of the SEC<0a> and SEC<0b> are coupled as complementary digit lines to the sense amplifiers SA_0 while the other half form an extended digit line across the area consumed by the sense amplifier SA_0 via a DL jumper and connect to the SA_1. Within the edge memory array mat 610(1), half of the digit line segments from each of the SEC<63a> and SEC<63b> are coupled as complementary digit lines to the sense amplifiers SA_64, while the other half form an extended digit line across the area consumed by the sense amplifier SA_64 via a DL juniper and connect to the SA_63. As such, the digit lines connected to the SA _0 and SA_64 sense amplifiers are shorter than the digit lines connected to the sense amplifiers SA_1 to SA_63.

The SA<64> driver 660 and the SA<0> driver 662 are each configured to provide control signals (e.g., ACT and RNL signals) to activate the sense amplifiers SA_64 and SA _0, respectively. Similarly, the SA<63> driver 670 and the SA<1> driver 672 are each configured to provide control signals (e.g., ACT and RNL signals) to activate the sense amplifiers SA_63 and SA_1, respectively. Due to the differences in the lengths of the digit lines connected to each of the SA_0 and SA_64 as compared with the SA_1 and SA_63, the SA<64> driver 660 and the SA<0> driver 662 may be controlled using different control signals than the control signals used to control the SA<63> driver 670 and the SA<1> driver 672.

For example, the PSA1/2/3 signals for the SA<64> driver 660 and the SA<0> driver 662 may be set based on a combination of the EDGE SAP short VTC/delay Main and EDGE SAP no VTC/delay Main control signals and the NSA1/2/3 signals may be based on a combination of the SAN short VTC/delay Main and EDGE SAN no VTC/delay Main control signals. Similarly, the PSA1/2/3 signals for the SA<63> driver 670 and the SA<1> driver 672 may be set based on the SAP VTC/MAIN control signal and the NSA1/2/3 signals may be based on the SAN VTC/MAIN control signal. Each of the PSA1/2/3 may control a respective section of the p-side driver, with the respective sections having different widths, in some examples. Similarly, each of the NSA1/2/3 may control a respective section of the n-side driver, with the respective sections having different widths, in some examples.

FIG. 7 depicts a p-side driver circuit 700 and an n-side driver circuit 701 in accordance with embodiments of the disclosure. The p-side driver circuit 700 includes a first p-side driver transistor 710, a second p-side driver transistor 712, and a third p-side driver transistor 714. The first p-side driver transistor 710, the second p-side driver transistor 712, and the third p-side driver transistor 714 may each have different widths. For example, the third p-side driver transistor 714 may have a first width, the second p-side driver transistor 712 may have a second width, and the first p-side driver transistor 710 may have a third width. In some examples, the second width may be double the first width and the third width may be triple the first width. In other examples, the second width may be double the first width and the third width may be quadruple the first width.

The n-side driver circuit 701 includes a first n-side driver transistor 720, a second n-side driver transistor 722, and a third n-side driver transistor 724. The first n-side driver transistor 720, the second n-side driver transistor 722, and the third n-side driver transistor 724 may each have different widths. For example, the third n-side driver transistor 724 may have a first width, the second n-side driver transistor 722 may have a second width, and the first n-side driver transistor 720 may have a third width. In some examples, the second width may be double the first width and the third width may be triple the first width. In other examples, the second width may be double the first width and the third width may be quadruple the first width.

Turning back to FIG. 6, the SAP/EDGE SAN short VTC/delay Main and SAP/EDGE SAN no VTC/delay Main control signals may both be set active at the same time during the main sense phase. However, during the VTC phase, only the EDGE SAN short VTC/delay Main control signal may be set active. Thus, a combination by which the PSA1/2/3 and NSA1/2/3 signals are connected to the SAP/EDGE SAN short VTC/delay Main and SAP/EDGE SAN no VTC/delay Main control signals may control a width of the p-side and n-side drivers in the SA<64> driver 660 and the SA<0> driver 662 (e.g., and in the SA<63> driver 670 and SA<1> driver 672), as well as a SAN:SAP ratio of n-side to p-side width. As an example, if the PSA1/2/3 signals for the p-side driver and NSA1/2/3 signals for n-side driver each have a 3*W, 2*W, and W (e.g., W=width), respectively, as shown in FIG. 6, the SAN:SAP ratio of the SA<64> driver 660 is 2:4 and the SAN:SAP ratio of the SA<0> driver 662 is 3:3 during the VTC phase. While the SA<64> driver 660 and the SA<0> driver 662 are depicted as having different SAN:SAP ratios during the VTC phase, it is appreciated that they may have the same ratio. Each ratio may be based on characteristics of the SA<64> driver 660 and the SA<0> driver 662, as well as characteristics of the respective sense amplifiers SA_0 and SA_64. While the SA<63> driver 670 and the SA<1> driver 672 are shown with the same 3:3 SAN:SAP ratio, the SA<63> driver 670 and the SA<1> driver 672 may have different SAN:SAP ratios.

Figure 8:
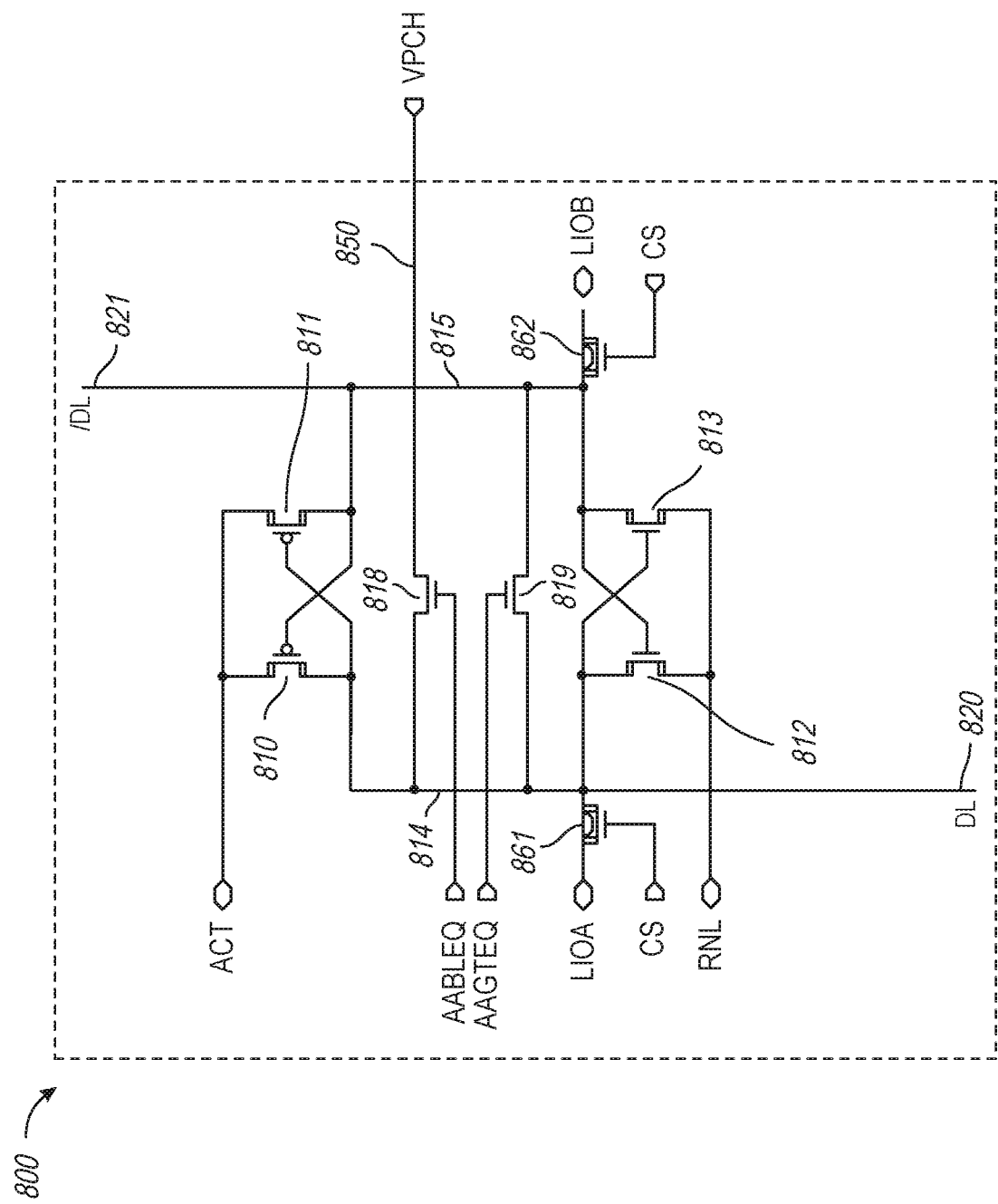
FIG. 8 is a circuit diagram of a sense amplifier in accordance with an embodiment of the disclosure.

FIG. 8 is a circuit diagram of a (e.g., basic or traditional) sense amplifier 800 in accordance with an embodiment of the disclosure. The sense amplifier 800 may be included in one or more of the sense amplifiers 150 of FIG. 1. Any of the sense amplifier banks 220(1), 220(2), 230(1), or 230(2) of FIG. 2, the edge sense amplifier driver 360 or the sense amplifier driver 370 of FIG. 3, and/or any of the sense amplifiers SA_0 to SA_64 of FIG. 6 may implement one or more of the sense amplifiers 800 in some examples. The sense amplifier 800 may include first type of transistors (e.g. p-type field effect transistors (PFET)) 810, 811 having drains coupled to drains of second type of transistors (e.g., n-type field effect transistors (NFET) 812, 813, respectively. The first type of transistors 810, 811 and the second type of transistors 812, 813 form complementary transistor inverters including a first inverter including the transistors 810 and 812 and a second inverter including the transistors 811 and 813. The first type of transistors 810, 811 may be coupled to a Psense amplifier control line (e.g., an activation signal ACT), which may provide a supply voltage (e.g., an array voltage VARY) at an active "high" level. The second type of transistors 812, 813 may be coupled to an Nsense amplifier control line (e.g., a Row Nsense Latch signal RNL) that may provide a reference voltage (e.g., a ground (GND) voltage) at an active "low" level. The sense amplifier 800 may sense and amplify the data state applied to sense nodes 814, 815 through the digit (or bit) lines DL 820 and /DL 821, respectively. The digit lines DL 820 and /DL 821 (sense nodes 814 and 815) may be coupled to local input/output nodes A and B (LIOA/B) through the second type of transistors 861 and 862, respectively, which may be rendered conductive when a column select signal CS is active. LIOT and LIOB may correspond to the LIOT/B lines of FIG. 1, respectively.

The sense amplifier 800 may further include transistors 818, 819, where the transistor 818 may couple the sense node 814 to a global power bus 850 and the transistor 819 may couple the sense node 814 to the sense node 815. The global power bus 850 may be coupled to a node that is configured to provide a precharge voltage VPCH. In some examples, the VPCH voltage is hit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 818 and 819 may couple the global power bus 850 to the sense nodes 814 and 815 responsive to equilibrating signals AAGTEQ and AABLEQ provided on gates of the transistors 818 and 819.

In operation, the sense amplifier 800 may be configured to sense a data state of a coupled memory cell on the digit lines DL 820 and /DL 821 in response to received control signals (e.g., the ACT and RNL signals, the AABLEQ and AAGTEQ equalization signals, and the CS signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include an initial precharge/equalize phase and a sense phase.

During the initial precharge/equalize phase of a sense operation, the sense nodes 814 and 815 may be precharged at the VPCH voltage. For example, the global power bus 850 may be supplied with the VPCH voltage, and the AAGTEQ and AABLEQ signals may be in their active states, respectively. Accordingly, while in the initial precharge or standby phase, each of the digit lines DL 820 and /DL 821 and the sense nodes 814 and 815 may be precharged to the precharge voltage VPCH. In some examples, the VPCH voltage may be approximately half of the array voltage.

At the end of the initial precharge/equalize phase or the start of the sense phase, a wordline WL associated with the sense operation may be set to an active state. In some other examples, the wordline WL may be activated during the threshold voltage compensation phase.

During the sense phase (e.g., main sense phase), the sense amplifier 800 may sense a data state of memory cell coupled to the digit line DL 820 or /DL 821. After activation of the wordline WL, the ACT signal and the RNL signal being activated and set to the logic high level (e.g., the VARY voltage) and the logic low level (e.g., the GND voltage), respectively. During the sense phase, sense and amplify operations are then performed with the threshold voltage compensation voltage to balance the responses of the second type of transistors 812 and 813. For example, in response to a memory cell being coupled to a digit line DL 820 or /DL 821 through its respective access device, a voltage difference is created between the digit lines DL 820 and /DL 821. The voltage difference is sensed by the second type of transistors 812, 813 as the sources of the second type of transistors 812, 813 begin to be pulled to ground through fully activated RNL signal, and one of the second type of transistors 812, 813 with a gate coupled to the digit line DL 820 or /DL 821 with the slightly higher voltage begins conducting. When a memory cell coupled to sense node 814 via the digit line DL 820 stores a high data state, for example, the transistor 813 may begin conducting. Additionally, the other transistor 812 may become less conductive as the voltage of the sense node 815 with the slightly lower voltage decreases through the conducting transistor 813. Thus, the slightly higher and lower voltages are amplified to logic high and logic low voltages.

After the data state of the memory cell is sensed, and the sense nodes 814, 815 are each pulled to a respective one of the ACT signal and RNL signal voltages, a read may be performed in response to a READ command. For example, the CS signal may be activated (e.g., in response to the READ command), the digit lines DL 820 and /DL 821 (e.g., at sense nodes 814 and 815) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

Figure 9:
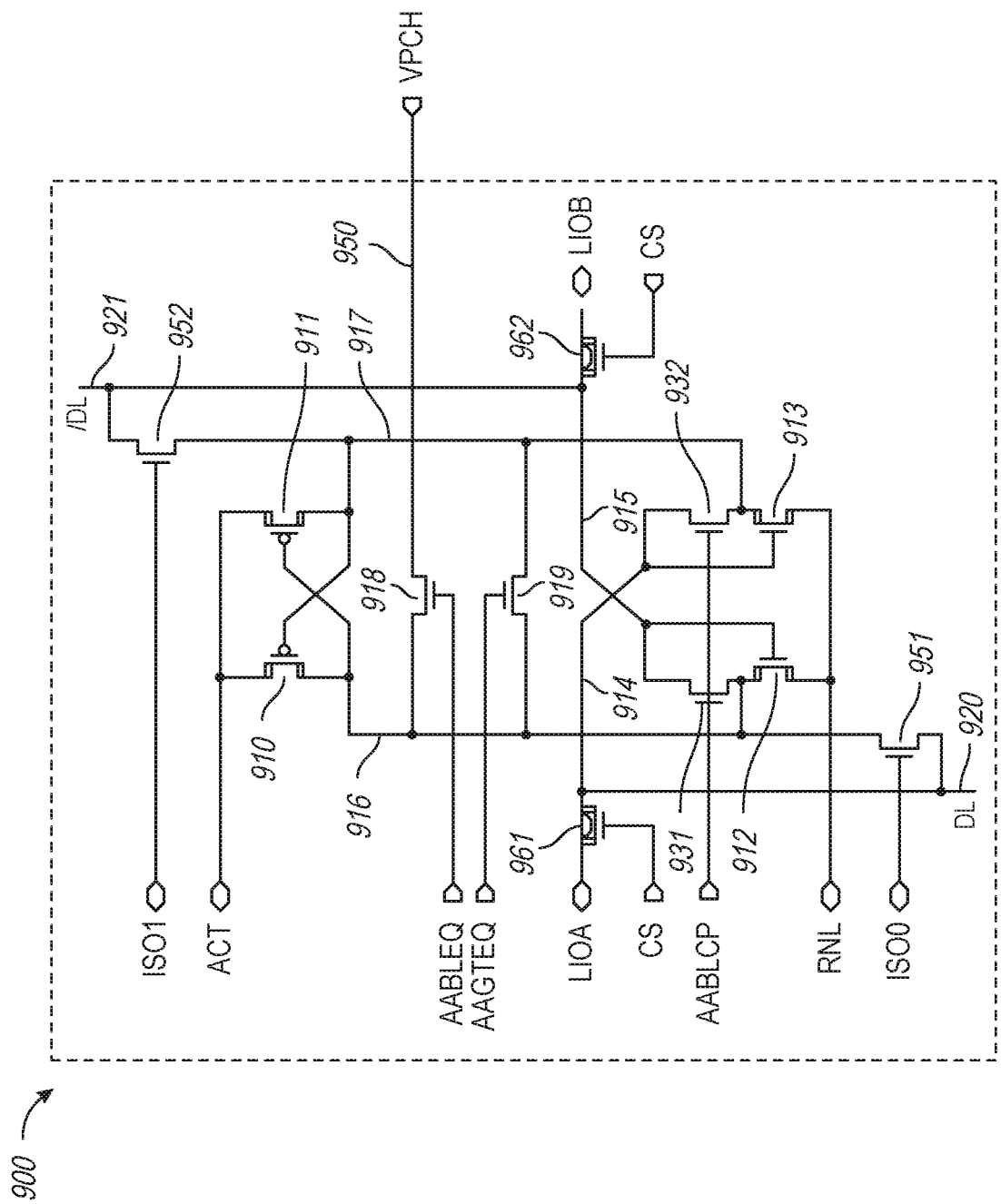
FIG. 9 is a circuit diagram of a threshold voltage compensation (VtC) sense amplifier in accordance with an embodiment of the disclosure.

FIG. 9 is a circuit diagram of a threshold voltage compensation (VtC) sense amplifier 900 in accordance with an embodiment of the disclosure. The VtC sense amplifier 900 may be included in one or more of the sense amplifiers 150 of FIG. 1. Any of the sense amplifier banks 220(1), 220(2), 230(1), or 230(2) of FIG. 2, the edge sense amplifier driver 360 or the sense amplifier driver 370 of FIG. 3, and/or any of the sense amplifiers SA_0 to SA_64 of FIG. 6 may implement one or more of the VtC sense amplifiers 900 in some examples. The VtC sense amplifier 900 may include first type of transistors (e.g. p-type field effect transistors (PFET)) 910, 911 having drains coupled to drains of second type of transistors (e.g., n-type field effect transistors (NFET) 912, 913, respectively. The first type of transistors 910, 911 and the second type of transistors 912, 913 form complementary transistor inverters including a first inverter including the transistors 910 and 912 and a second inverter including the transistors 911 and 913. The first type of transistors 910, 911 may be coupled to a Psense amplifier control line (e.g., an activation signal ACT), which may provide a supply voltage (e.g., an array voltage VARY) at an active "high" level. The second type of transistors 912, 913 may be coupled to an Nsense amplifier control line (e.g., a Row Nsense Latch signal RNL) that may provide a reference voltage (e.g., a ground (GND) voltage) at an active "low" level. The VtC sense amplifier 900 may sense and amplify the data state applied to sense nodes 914, 915 through the digit (or bit) lines DL 920 and /DL 921, respectively. Nodes 916 and 917 that may be gut nodes coupled to drains of the second type of transistors 912, 913 may be coupled to the digit lines DL 920 and /DL 921 via isolation transistors 951 and 952. The isolation transistors 951 and 952 may be controlled by isolation signals ISO0 and ISO1. The digit lines DL 920 and /DL 921 (sense nodes 914 and 915) may be coupled to local input/output nodes A and B (LIOA/B) through the second type of transistors 961 and 962, respectively, which may be rendered conductive when a column select signal CS is active. LIOT and LIOB may correspond to the LIOT/B lines of FIG. 1, respectively.

The VtC sense amplifier 900 may further include additional second type of transistors 931, 932 that have drains coupled to the sense nodes 915 and 914 and sources coupled to both the gut nodes 916 and 917 and the drains of the second type of transistors 912 and 913. Gates of the second types of transistors 931, 932 may receive a bit line compensation signal AABLCP and may provide voltage compensation for threshold voltage imbalance between the second type of transistors 912 and 913. The VtC sense amplifier 900 may further include transistors 918, 919, where the transistor 918 may couple the gut node 916 to a global power bus 950 and the transistor 919 may couple the gut node 916 to the gut node 917. The global power bus 950 may be coupled to a node that is configured to provide a precharge voltage VPCH. In some examples, the VPCH voltage is bit line precharge voltage VBLP. In some examples, the VPCH voltage may be set to the VARY voltage during some phases of a sense operation. The voltage of the array voltage VARY may be less than the voltage of the bit line precharge voltage VBLP. In some examples, the bit line precharge voltage VBLP may be approximately one-half of the array voltage VARY. The transistors 918 and 919 may couple the global power bus 950 to the gut nodes 916 and 917 responsive to equilibrating signals AAGTEQ and AABLEQ provided on gates of the transistors 918 and 919.

In operation, the VtC sense amplifier 900 may be configured to sense a data state of a coupled memory cell on the digit lines DL 920 and /DL 921 in response to received control signals (e.g., the ISO0/ISO1 isolation signals, the ACT and RNL signals, the AABLEQ and AAGTEQ equalization signals, the CS signal, and the AABLCP signal). The control signals may be provided by a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof. A sense operation may include several phases, such as an initial precharge or standby phase, a compensation phase, a gut equalize phase, and a sense phase.

During the initial precharge or standby phase of a sense operation, the gut nodes 916 and 917 may be precharged at the VPCH voltage. For example, the global power bus 950 may be supplied with the VPCH voltage and the AABLCP signal, the ISO0/ISO1 signals, and the AAGTEQ and AABLEQ signals may be in their active states, respectively. Accordingly, while in the initial precharge or standby phase, each of the digit lines DL 920 and /DL 921, the sense nodes 914 and 915 and the gut nodes 916 and 917 may be precharged to the precharge voltage VPCH. In some examples, the VPCH voltage may be approximately half of the array voltage.

After the initial precharge or standby phase, the VtC sense amplifier 900 may enter the threshold voltage compensation phase, where voltages on the digit lines DL 920 and /DL 921 are biased from the VPCH voltage (e.g., VBLP voltage) to compensate (e.g., provide threshold voltage compensation) for threshold voltage differences between the transistors 912, 913. During the compensation phase, the ISO0 and ISO1 signals and the AAGTEQ and AABLEQ signals may be set to respective inactive state to disable the transistors 951, 952, 918 and 919. The AABLCP signal may remain in an active state to enable the transistors 931 and 932 to couple the nodes 914 and 915 to the gut nodes 917 and 916, respectively. Additionally, the drain and the gate of the transistor 912 may be coupled and the drain and the gate of the transistor 913 may be coupled. At the end of the threshold voltage compensation phage, the AABLCP signal may transition to an inactive state, which disables the transistors 931 and 932 and decouples the nodes 914 and 915 from the gut nodes 917 and 916, respectively.

During the gut equalize phase, the gut nodes 917 and 916 may be decoupled from the digit lines DL 920 and /DL 921 and may be coupled to each other to equalize voltages between the gut nodes 916, 917 to the VPCH voltage. During this phase, the AAGTEQ and AABLEQ signals may transition to an active state. While the AABLCP signal is set to the inactive state, the transistors 932 and 931 may decouple the nodes 914 and 915 from the gut nodes 917 and 916. While the equilibrating signals AAGTEQ and AABLEQ are set to the active state, the transistors 918 and 919 may couple the VPCH voltage from the global power bus 950 to the gut nodes 916, 917. While the ISO0 and ISO1 signals are set to the inactive state, the isolation transistors 951 and 952 may decouple the gut nodes 917 and 916 from the digit lines DL 920 and /DL 921. After the to the gut nodes 916 and 917 are precharged to the VPCH voltage, the AAGTEQ and AABLEQ signals may be set to inactive states to disable the transistors 918 and 919. Also during the gut equalization phase, a wordline WL associated with the sense operation may be set to an active state. In some other examples, the wordline WL may be activated during the threshold voltage compensation phase.

During the sense phase (e.g., main sense phase), the VtC sense amplifier 900 may sense a data state of memory cell coupled to the digit line DL 920 or /DL 921. Initially, the ISO0 and ISO1 isolation signals may be set to an active state, followed by the ACT signal and the RNL signal being activated and set to the logic high level (e.g., the VARY voltage) and the logic low level (e.g., the GND voltage), respectively. Responsive to the ISO0 and ISO1 isolation signals transitioning to the active state, the ISO transistor 951 may couple the digit line DL 920 to the gut node 916 and the ISO transistor 952 may couple the digit line /DL 921 to the gut node 917. During the sense phase, sense and amplify operations are then performed with the threshold voltage compensation voltage to balance the responses of the second type of transistors 912 and 913. For example, in response to a memory cell (e.g., one of the memory cells 240(0)-(N) or memory cells 241(0)-(N) of FIG. 2) being coupled to a digit line DL 920 or /DL 921 through its respective access device, a voltage difference is created between the digit lines DL 920 and /DL 921 (e.g., via the guts nodes 916 and 917). The voltage difference is sensed by the second type of transistors 912, 913 as the sources of the second type of transistors 912, 913 begin to be pulled to ground through fully activated RNL signal, and one of the second type of transistors 912, 913 with a gate coupled to the digit line DL 920 or /DL 921 with the slightly higher voltage begins conducting. When a memory cell coupled to the gut node 916 through the digit line DL 920 stores a high data state, for example, the transistor 913 may begin conducting. Additionally, the other transistor 912 may become less conductive as the voltage of the gut node 917 with the slightly lower voltage decreases through the conducting transistor 913. Thus, the slightly higher and lower voltages are amplified to logic high and logic low voltages while the isolation signals ISO0 and ISO1 in the active state.

Because the isolation signals ISO0 and ISO1 were set active to couple the gut nodes 916, 917 to the respective digit lines DL 920 and /DL 921 prior to activating sense amplifier (e.g., setting the ACT signal and the RNL signal active), the gut nodes 916, 917 (e.g., and digit lines DL 920 and /DL 921) may be steadily driven to the ACT and RNL voltages, respectively.

After the data state of the memory cell is sensed, and the sense nodes 914, 915 are each pulled to a respective one of the ACT signal and RNL signal voltages, a read may be performed in response to a READ command. For example, the CS signal may be activated (e.g., in response to the READ command), the digit lines DL 920 and /DL 921 (e.g., at sense nodes 914 and 915) may be coupled to the LIO nodes (LIOT and LIOB) and the data output may be provided to the LIO nodes. Thus, the data may be read out from the LIO nodes. After a read operation is completed, the CS signal may be set to an inactive state. The process may start over for a subsequent sensing operation.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus comprising:
a first sense amplifier coupled to a first pair of digit lines each having a first length;
a second sense amplifier coupled to a second pair of digit lines each having a second length different than the first length; and
a control circuit configured to, during a main sense phase of a sense operation, cause the first sense amplifier to activate at a first time prior to activation of the second sense amplifier at a second time.

2. The apparatus of claim 1, wherein the first length is longer than the second length.

3. The apparatus of claim 1, wherein the first length is two times greater than the second length.

4. The apparatus of claim 1, wherein the control circuit is further configured to, during a threshold voltage compensation phase of the sense operation, cause the first sense amplifier to activate for a first time duration and cause the second sense amplifier to activate for a second time duration.

5. The apparatus of claim 4, wherein the second time duration is shorter than the first time duration.

6. The apparatus of claim 1, further comprising:
a first driver circuit configured to provide first activation signals to the first sense amplifier responsive to first control signals from the control circuit; and
a second driver circuit configured to provide second activation signals to the second sense amplifier responsive to second control signals from the control circuit.

7. The apparatus of claim 6, wherein control circuit is further configured to, during a threshold voltage compensation phase of the sense operation, cause the first driver to drive the activation signals using a first subset of first drive transistors and cause the second driver to drive the activation signals using a second subset of second drive transistors.

8. The apparatus of claim 7, wherein a width of the first subset of first drive transistors is different than a width of the second subset of second drive transistors.

9. The apparatus of claim 7, wherein a width of the first subset of first drive transistors is greater than a width of the second subset of second drive transistors.

10. The apparatus of claim 1, wherein the first sense amplifier is positioned between an inner memory array mat and an edge memory array mat and the second sense amplifier is positioned in the edge memory array mat.

11. An apparatus comprising:
a first sense amplifier bank positioned between an edge memory array mat and an inner memory array mat, wherein each sense amplifier of the first sense amplifier bank is coupled to a respective pair of complementary bitlines each having a first length;
a second sense amplifier bank positioned in the edge memory array mat, wherein each sense amplifier of the second sense amplifier bank is coupled to a respective pair of complementary bitlines each having a second length that is different than the first length; and
a control circuit configured to, during a threshold voltage compensation phase of a sense operation, cause the sense amplifiers of the first sense amplifier bank to activate for a first time duration and cause the sense amplifiers of the second sense amplifier bank to activate for a second time duration different from the first time duration.

12. The apparatus of claim 11, wherein the control circuit is configured to cause the second time duration to end prior to ending the first time duration.

13. The apparatus of claim 12, wherein the control circuit is configured to cause the second time duration and the first time duration to start contemporaneously.

14. The apparatus of claim 11, further comprising a first delay configured to control the first time duration and a second delay configured to control the second time duration.

15. The apparatus of claim 11, wherein the control circuit is further configured to, during a main sense phase of the sense operation, cause the first sense amplifier to activate at a first time prior to activation of the second sense amplifier bank at a second time.

16. The apparatus of claim 11, wherein the second length is less than the first length.

17. A method comprising:
- activating a first sense amplifier coupled to a first pair of digit lines each having a first length at a first time during a main sense phase of a sense operation; and
- activating a second sense amplifier coupled to a second pair of digit lines each having a second length at a second time during the main sense phase of the sense operation.

18. The method of claim 17, further comprising activating the second sense amplifier after a delay.

19. The method of claim 17, further comprising, during a threshold voltage compensation phase of the sense operation:
- activating the first sense amplifier for a first time duration; and
- activating the second sense amplifier for a second time duration that is shorter than the first time duration.

20. The method of claim 19, wherein the second time duration starts contemporaneously with the first time duration and ends before the first time duration ends.

* * * * *